(12) United States Patent
Yoshida et al.

(10) Patent No.: US 8,970,791 B2
(45) Date of Patent: Mar. 3, 2015

(54) CIRCUIT BOARD

(75) Inventors: Toshikazu Yoshida, Tokyo (JP); Hideaki Ozawa, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/233,565

(22) PCT Filed: Jul. 18, 2012

(86) PCT No.: PCT/JP2012/068182
§ 371 (c)(1),
(2), (4) Date: Jan. 17, 2014

(87) PCT Pub. No.: WO2013/015168
PCT Pub. Date: Jan. 31, 2013

(65) Prior Publication Data
US 2014/0146240 A1    May 29, 2014

(30) Foreign Application Priority Data
Jul. 28, 2011  (JP) .................. 2011-165295

(51) Int. Cl.
| | | |
|---|---|---|
| H04N 5/50 | (2006.01) | |
| H04B 1/18 | (2006.01) | |
| H04H 20/71 | (2008.01) | |
| H04J 4/00 | (2006.01) | |
| H03F 3/195 | (2006.01) | |
| H03H 7/24 | (2006.01) | |
| H03H 7/48 | (2006.01) | |
| H05K 1/02 | (2006.01) | |

(52) U.S. Cl.
CPC ............... *H04N 5/50* (2013.01); *H03F 3/195* (2013.01); *H03H 7/24* (2013.01); *H03H 7/48* (2013.01); *H05K 1/0243* (2013.01); *H05K 2201/09254* (2013.01)

USPC ........... 348/731; 455/281; 455/3.01; 370/436

(58) Field of Classification Search
CPC ......... H04N 5/50; H04N 5/46; H04N 5/4401; H04N 21/4263; H04N 21/4383; H04N 21/4382; G09G 3/3614
See application file for complete search history.

(56) References Cited

U.S. PATENT DOCUMENTS

| 6,791,995 B1* | 9/2004 | Azenkot et al. ............... 370/436 |
| 2006/0035585 A1* | 2/2006 | Washiro ........................ 455/3.01 |
| 2012/0200782 A1* | 8/2012 | Imai et al. ..................... 348/731 |

FOREIGN PATENT DOCUMENTS

| JP | 2001-196816 | 7/2001 |
| JP | 2002-152611 | 5/2002 |
| JP | 2006-054812 | 2/2006 |

* cited by examiner

*Primary Examiner* — Jefferey Harold
*Assistant Examiner* — Sean Haiem
(74) *Attorney, Agent, or Firm* — Sony Corporation

(57) ABSTRACT

Provided a circuit board including an input terminal to which a high-frequency signal is input, a high-frequency amplifier for amplifying the high-frequency signal input to the input terminal, at least one distributor distributing the high-frequency signal, a plurality of high-frequency processing circuits of which transmission path lengths for inputting each of the high-frequency signals distributed by the distributor into signal inputting sections of the plurality of high-frequency processing circuits are different from one another, and a plurality of attenuating devices which are mounted at previous stages of each of the plurality of high-frequency processing circuits and possess amounts of attenuation which increase with decrease of the transmission path lengths.

11 Claims, 5 Drawing Sheets

CIRCUIT BOARD

CROSS REFERENCES TO RELATED APPLICATIONS

The present application is a national stage of International Application No. PCT/JP2012/068182 filed on Jul. 18, 2012 and claims priority to Japanese Patent Application No. 2011-165295 filed on Jul. 28, 2011, the disclosure of which is incorporated herein by reference.

BACKGROUND

The present disclosure relates to a circuit board, especially to the circuit board mounting a plurality of high-frequency processing circuits.

In recent years, in a receiving apparatus for receiving high-frequency signals, a plurality of high-frequency processing circuits have been equipped for processing the received high-frequency signals. For example, in a television receiver, a plurality of broadcast waves of the same broadcast form or different broadcast forms can be simultaneously watched or simultaneously recorded by mounting a plurality of tuner sections as the high-frequency processing circuits.

When the plurality of high-frequency processing circuits are equipped in this manner, the high-frequency signals input to the respective high-frequency processing circuits may have the different signal levels if the distances from the input terminal of the high-frequency signal to the respective high-frequency processing circuits are different from one another. When the signal levels of the high-frequency signals to be input include a difference, the respective high-frequency processing circuits may have a different degree of susceptibility (non-susceptibility) to noise. Thereby, a problem arises that even for the high-frequency processing circuits arranged on the same circuit board, one can receive the high-frequency signal and the other cannot.

When the distances between the respective high-frequency processing circuits and the input terminal of the high-frequency signal are made equal, such a problem does not arise. For example, in Patent Literature 1, two tuner sections are arranged in a receiving apparatus including the above tuner sections such that the distances from an input terminal are substantially equal.

CITATION LIST

Patent Literature

Patent Literature 1: JP 2002-152611A

SUMMARY

Technical Problem

On the other hand, the demand for the thinning and the miniaturization of the apparatus mounting the high-frequency processing circuits is increasing, and the thinning and the miniaturization of a tuner module mounting a tuner section is also increasing. When the tuner module is thinned or miniaturized, in most cases, the restriction is generated with respect to the position of the arranged tuner section. That is, it is difficult to arrange a plurality of the tuner sections at positions where distances from an input terminal are substantially equal.

The present disclosure has been made in view of this aspect, and an object thereof is, also in a case that the distances from the input terminal to the respective high-frequency processing circuits are not equal, to equalize the signal levels of the high-frequency signals input to the respective high-frequency processing circuits.

Solution to Problem

In order to solve the above problem, the circuit board of the present disclosure possesses a configuration including an input terminal, at least one distributor, a plurality of high-frequency processing circuits and a plurality of attenuating devices, and the respective configurations and the functions of the respective sections are as follows. High-frequency signals are input to the input terminal. The distributor distributes the high-frequency signals input to the input terminal. The plurality of high-frequency processing circuits include the different lengths of the transmission paths of the respective high-frequency signals distributed by the distributor and input to signal inputting sections. The plurality of attenuating devices are mounted at the previous stages of the respective high-frequency processing circuits. The shorter length of the transmission path establishes the larger amount of attenuation.

In accordance with this configuration, the high-frequency signal largely attenuated by the attenuating device is input to the high-frequency processing circuit having a distance nearer to the input terminal while the high-frequency signal slightly attenuated or not attenuated is input to the high-frequency processing circuit having a distance farther to the input terminal. Thereby, the signal levels of the high-frequency signals input to the respective high-frequency processing circuits are equalized to the signal level of the high-frequency processing circuit which is located at the farthest position from the input terminal and includes the largest transmission loss.

Advantageous Effects of invention

In accordance with the circuit board of the present disclosure, the signal levels of the high-frequency signals input to the respective high-frequency processing circuits can be equalized even when the distances from the input terminal to the respective high-frequency processing circuits are not equal.

Additional features and advantages are described herein, and will be apparent from the following Detailed Description and the figures.

DETAILED DESCRIPTION

Figure 1:
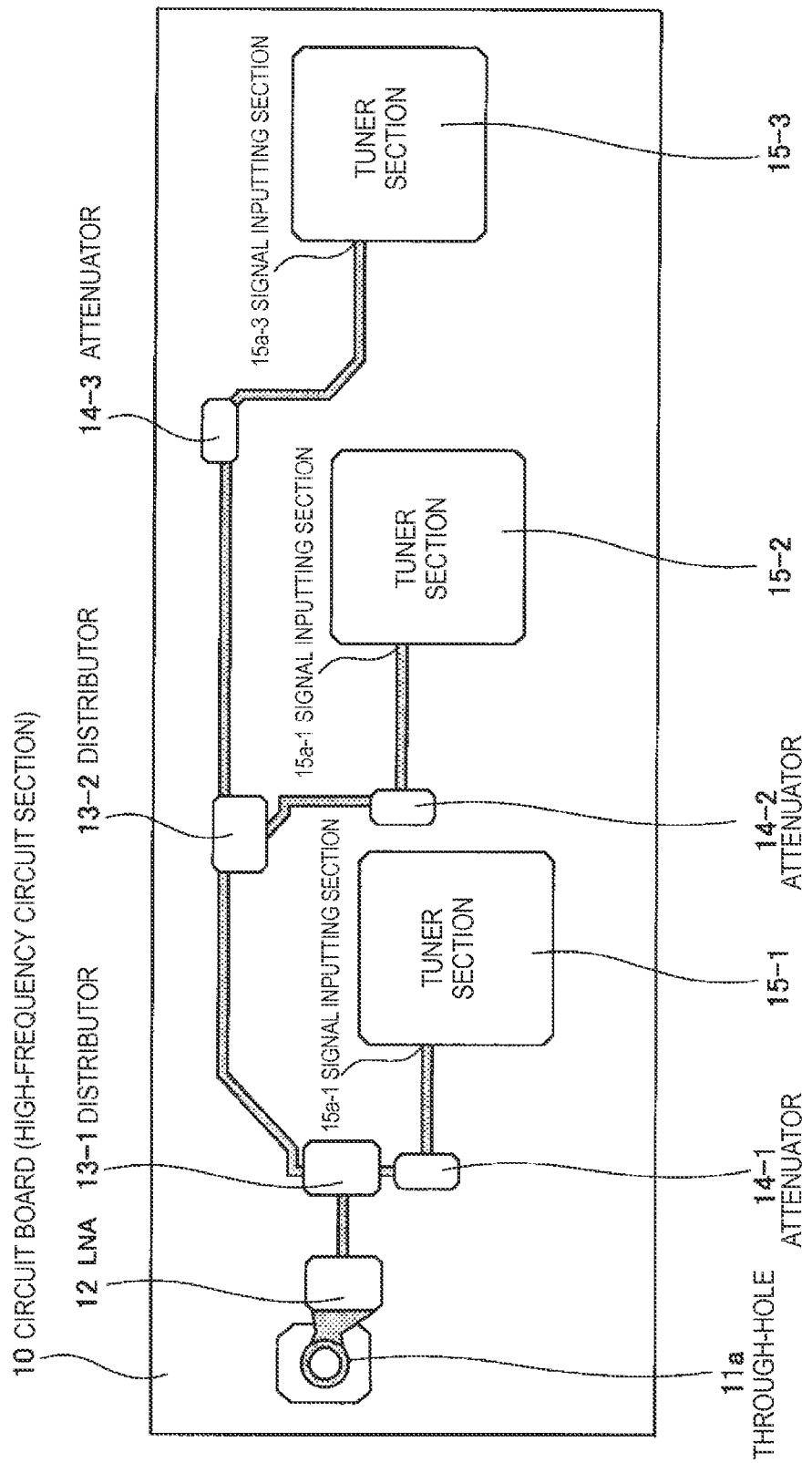
FIG. 1 is an exemplary configuration diagram of a circuit board when three high-frequency processing circuits are arranged in a transverse direction along a longer side of the circuit board in accordance with an embodiment of the present disclosure.

An example of a circuit board in accordance with an embodiment of the present disclosure will be hereinafter described with reference to the appended drawings according to the following order.
1. A configuration example of a circuit board mounting a tuner section as a high-frequency processing circuit
2. Various modification examples 1. A Configuration Example of a Circuit Board Mounting a Tuner Section Acting as a High-Frequency Processing Circuit At first, a circuit board in in accordance with an embodiment of the present disclosure will be described referring to FIG. 1. FIG. 1 is a mounting diagram showing a configuration example of a circuit board mounting a tuner section as a high-frequency processing circuit. The circuit board 10 shown in FIG. 1 is mounted on a receiving apparatus not shown in the drawings. The receiving apparatus receives broadcast waves of a ground-wave digital television broadcast (hereinafter also referred to as "high-frequency signals"), and decodes coded data with respect to images and sounds contained in the high-frequency signals. Then, the decoded data are transmitted to a displaying apparatus not shown in the drawings, and are recorded in a recording medium not shown in the drawings.

Only a high-frequency circuit section generally referred to as "RF front end" among various circuits constituting the receiving apparatus is shown in FIG. 1. Although only a case where the receiving apparatus receives the broadcast waves of the ground-wave digital television broadcast is employed, a configuration of receiving other broadcast waves for the satellite broadcasting and the cable television broadcasting is possible.

The circuit board 10 includes a through-hole 11a to which a central conductor connecting section of a connector piece constituting an antenna input terminal not shown in the drawings, and a low noise amplifier (hereinafter referred to as LNA) 12. A distributor 13-1 to a distributor 13-2, an attenuator 14-1 to an attenuator 14-3 as attenuating devices, and a tuner section 15-1 to a tuner section 15-3 are also included.

In FIG. 1, other circuits such as a PLL circuit and a balun which are not essential parts of the present disclosure constituting the high-frequency circuit section are omitted therein. In the following description, when the distributor 13-1 to the distributor 13-2 are not required to be discriminated from each other, they are simply denoted as "distributors 13", and when the attenuator 14-1 to the attenuator 14-3 are not required to be discriminated from one another, they are simply denoted as "attenuators 14". When the tuner section 15-1 to the tuner section 15-3 are not required to be discriminated from one another, they are simply denoted as "tuner sections 15". When a signal inputting section 15a-1 to a signal inputting section 15a-3 are not required to be discriminated from one another, they are simply denoted as "signal inputting sections 15a".

The broadcast waves for the ground-wave digital television broadcast received by an antenna not shown in the drawings are input to the antenna input terminal connected to the through-hole 11a. The LNA 12 amplifies the broadcast waves input from the antenna input terminal (high-frequency signal) and sends the broadcast waves to a subsequent stage. The gain of the LNA 12 is established to compensate the distribution loss by the distributors 13 of the next stage or later, the attenuation of the attenuators 14 and the transmission loss. The value (gain) is automatically adjusted by the mechanism of AGC (Automatic Gain Control) not shown in the drawings.

The distributor 13-1 distributes the high-frequency signals output from the LNA 12 into two and outputs the high-frequency signals. That is, the high-frequency signals are distributed into two parts, one of which is the signals input to the tuner section 15-1 and the other of which is the signals input to the tuner section 15-2 and to the tuner section 15-3. The distributor 13-2 distributes the high-frequency signals output from the distributor 13-1 into two parts, one of which is the signals input to the tuner section 15-2 and the other of which is the signals input to the tuner section 15-3.

The attenuator 14-1 is positioned between the distributor 13-1 and the tuner section 15-1, and attenuates the high-frequency signals input to the tuner section 15-1 to the specified level. A π-type attenuator and T-type attenuator can be used as the respective attenuators 14. Amounts of attenuation of the respective attenuators 14 can be adjusted by changing a ratio between a resistor element R1 and a resistor element R2 constituting the attenuators 14 and not shown in the drawings.

The attenuator 14-2 is positioned between the distributor 13-2 and the tuner section 15-2, and attenuates the high-frequency signals input to the tuner section 15-2 to the specified level. The attenuator 14-3 is positioned between the distributor 13-2 and the tuner section 15-3, and attenuates the high-frequency signals input to the tuner section 15-3 to the specified level. The amounts of attenuation established in the respective attenuators 14 are established such that all the signal levels of the high-frequency signals input to the signal inputting sections 15a of the respective tuner sections 15 are equalized.

The tuner section 15-1 to the tuner section 13 include BPF (Ban Pass Filer) and AGC (Automatic Gain Control), a local oscillator and a frequency converter, which are not shown in the drawings, amplifies the input high-frequency signals, selects the signals having the same frequency as that of a receiving channel, and outputs the signals. In the present embodiment, the respective tuner sections 15 are constituted as IC (Integrated Circuit) chips.

The signal levels of the high-frequency signals input to the respective e sections 15 increasingly attenuates with the increase of the distance from the through-hole 11a (the position of connecting the antenna input terminal) on the circuit board 10. That is, the level of the high-frequency signals input to the signal inputting section 15a-3 of the tuner section 15-3 located at the farthest position is lower than the level of the high-frequency signals input to the signal inputting section 15a-1 of the tuner section 15-1 located at the nearest position with respect to the position of connecting the antenna input terminal. Since, for example, the tuner section 15-3 is located at the farthest position with respect to the position of connecting the antenna input terminal, the length of the transmission path through which the signals amplified by the LNA 12 are transmitted is the longest. In this manner, the transmission loss generated through the passage of the transmission path also increases.

In the circuit board 10 of the present disclosure, in order to eliminate such the difference of the signal levels, the signal levels of the high-frequency signals input to the respective tuner sections 15 are consolidated to the level the same as that of the tuner section 15-3 located at the farthest from the position of connecting the antenna input terminal.

Specifically, a larger value of attenuation is established for the attenuator 14-1 located at the previous stage of the tuner section 15-1 positioned at the nearest to the position of connecting the antenna input terminal. A medium value of attenuation is established for the attenuator 14-2 located at the previous stage of the tuner section 15-2 of which a distance from the position of connecting the antenna input terminal is second nearest to the tuner section 15-1. An amount of attenuation is set to be zero in the attenuator 14-3 attenuating the input signals to the tuner section 15-3 located at the farthest position from the position of connecting the antenna input terminal.

A means of setting the amount of attenuation to zero includes a means of short-circuiting a resistor (not shown in the drawings) constituting the attenuator 14-3. Alternatively; no attenuator may be configured in the tuner section 15-3 positioned at the farthest from the position of connecting the antenna input terminal such that the signal is directly input thereto.

In this manner, the signal levels of the high-frequency signals input to the signal inputting sections 15a of the respective tuner sections 15 are consolidated to the weakest level by adjusting the amounts of attenuation of the respective attenuators 14. That is, all the signal levels of the high-frequency signals input to the signal inputting sections 15a of the respective tuner sections 15 can be equalized.

The levels of the signals input to the respective tuner sections 15 are weakened after the passage of the respective attenuators 14. However, a degree of worsening noise figures (hereinafter referred to as "NF") of the entire high-frequency circuit section shown in FIG. 1 can be suppressed to be low by arranging the LNA 12 at the previous stage of the distributor 13-1. More in detail, the noise figure of the entire high-frequency circuit section can be made better than the NF of the respective tuner sections 15 alone.

The NF of the entire high-frequency circuit section can be calculated based on the gain of the LNA 12, the distribution losses due to the respective distributors 13, the attenuation amounts of the respective attenuators 14, and the transmission losses generated through the passage of the transmission paths. If the respective distributors 13 and the respective attenuators 14 are considered to be as amplifiers having a minus gain, the high-frequency circuit section shown in FIG. 1 can be considered as a four-stage amplifier formed by the LNA 12, the respective distributors 13, the respective attenuators 14, and the respective tuner sections 15.

Figure 2:
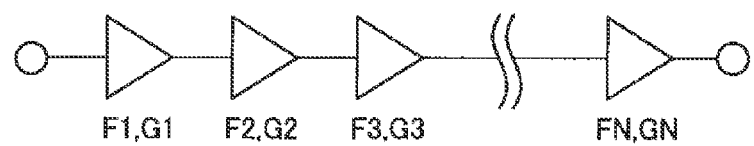
FIG. 2 is a diagram showing an example when N amplifiers are connected in series.

FIG. 2 is a diagram showing gains and NFs of the respective stages of an N-stage amplifier. G1, G2, G3 and GN show the gains, and F1, F2, F3 and FN show the NFs. The true value F of the total NFs of the N-stage amplifier can be represented by the following Equation 1.

$$F = F1 + (F2-1)/G1 + (F3-1)/G1*G2 + \ldots + (FN-1)/G1*G2* \ldots *GN-1 \qquad \text{(Equation 1)}$$

The NF of the entire N-stage amplifier can be represented by the following Equation 2 using (dB).

$$NF = 10 \log(F) \qquad \text{(Equation 2)}$$

In one example, the gains and the NFs of the respective stages in the configuration shown in FIG. 1 may have the following values. Values in brackets after the "dB" designate true values.

First stage: LNA12 ... G1=14 dB (25.11), NF1=2.5 dB (1.78)

Second stage: Distributor 13 ... G2=−4 dB (0.40), NF2=4 dB (2.51)

Third stage: Attenuator 14 ... G3=−5 dB (0.32), NF3=5 dB (3.16)

Fourth stage: Tuner section 15 ... NF4=5 dB (3,16)

When these values are inserted in the above Equation 1, the followings are obtained.

$$\begin{aligned} F(\text{true value}) &= NF1 + (NF2-1)/G1 + (NF3-1)/G1 * \\ &\quad G2 + (NF4-1)/G1*G2*G3 \\ &= 1.78 + (2.51-1)/25.11 + \\ &\quad (3.16-1)/(25.11*0.40) + \\ &\quad (3.16-1)/(25.11*0.4*0.32) \\ &= 1.78 + 0.06 + 0.22 + 0.67 \\ &= 2.73 \end{aligned}$$

When the obtained "F=2.73" is substituted into the above Equation 2, NF=10 log2.73=4.36 dB is calculated.

Since the NFs of the respective tuner sections 15 are 5 dB, it can be understood that the NFs of the entire high-frequency circuit section (4.36 dB) are better values (the NFs are improved).

In this manner, by adjusting the amounts of attenuation of the respective attenuators 14, the signal levels of the high-frequency signals input to the signal inputting sections 15a of the respective tuner sections 15 can be consolidated to the same level without worsening the NF of the entire high-frequency circuit. Thereby, the respective tuner sections 15 can be arranged such that the distances from the input terminal to the respective positions are different from one another. As shown in FIG. 1, the respective tuner sections 15 can be positioned in the transverse direction along the longer side of the circuit board 10. In a case of this arrangement, since the shorter side length of the circuit board 10 can be made shorter, the device on which the circuit board 10 is mounted can be also miniaturized.

As shown in FIG. 1, the respective tuner sections 15 are arranged such that the transmission paths for the high-frequency signals include straight lines as many as possible. This is because the strength difference and the impedance disturbance in the transmitted signals are often generated at corners (turns) of the transmission paths. By means of the wiring layout including many straight lines, the probability of arising these problems can be suppressed low. In the implementation diagram of FIG. 1, the respective tuner sections 15 are arranged among one another so as to be slightly displaced along the shorter side of the circuit board 10. In accordance with this arrangement, the number of the straight lines can be increased in the transmission paths of the high-frequency signals input to the respective tuner sections 15.

In the configuration shown in FIG. 1, the respective attenuators 14 are arranged as closely as possible to the signal inputting sections 15a of the respective tuner sections 15. Since the respective attenuators 14 attenuate the input signals to the fixed level and output the signals, the signals have the same level at the output terminals (not shown in the drawings) of the respective attenuators 14. When the distances of the wirings from the respective attenuators 14 to the respective tuner sections 15 are short, the changes in the signal levels are also minimum. That is, the signal levels when the signal levels are measured at the positions of the signal inputting sections 15a of the respective tuner sections 15 are substantially equal to the levels at the output terminals of the respective attenuatorsb 14.

When the signal levels of the high-frequency signals at the respective signal inputting sections 15a are different from one another at the respective tuner sections 15, the operating points of the respective tuner sections 15 configured as IC chips are different from one another. When the operation points of the respective tuner sections 15 are different from one another, the degrees of susceptibility (non-susceptibility) to noise also change at the respective tuner sections 15. In such a case, the respective tuner sections 15 are required to be controlled individually, so that the control by software is burdensome. In accordance with the circuit board 10 of the present disclosure, such the characteristic difference among the respective tuner sections 15 is not generated, so that the complicated control for removing the characteristic difference is also unnecessary.

In the above-mentioned embodiments, since the high-frequency signals attenuated by the respective attenuators 14 are input to the respective tuner sections 15, no high-frequency signals having excessive signal levels are input to the respective tuner sections 15. When the high-frequency signals having the higher signal levels and distorted wave shapes are input to the respective tuner sections 15, the characteristics of the demodulated signals are also worsened. Disturbing signals are likely to be mixed into oscillators which are not shown in the drawings and are embedded in the respective tuner sections 15, and when the disturbing signals are mixed into the oscillators, the respective tuner sections 15 themselves act as sources of oscillating the disturbing waves. When the disturbing signals are generated in the respective tuner sections 15, the disturbing signals are leaked to the signal lines to cause mutual interference among the respective tuner sections 15. That is, no isolation among the respective tuner sections 15 can be formed. In accordance with the above-mentioned embodiments, the occurrence of these problems can be reduced.

2. VARIOUS MODIFICATION EXAMPLES

Figure 3:
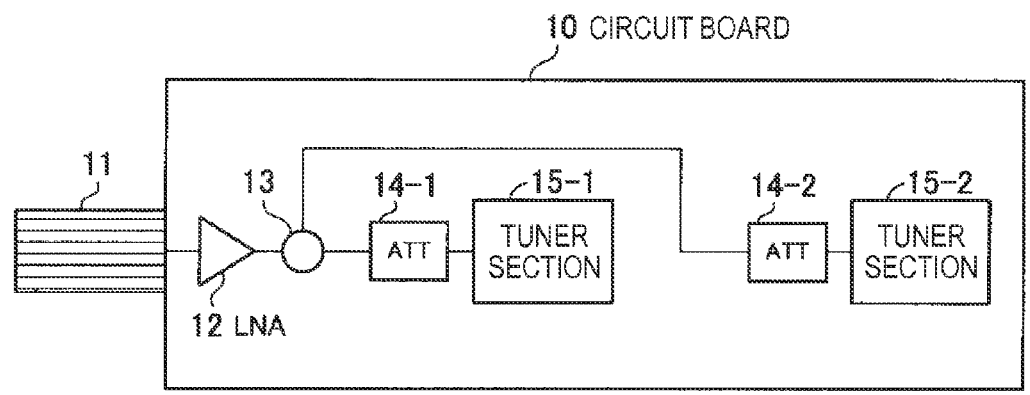
FIG. 3 is an exemplary configuration diagram of a circuit board when two high-frequency processing circuits are arranged in a transverse direction along a longer side of the circuit board in accordance with an embodiment of the present disclosure.

Although, in the above-mentioned embodiments, the example having three tuner sections 15 is described, the number of the tuner sections 15 is not restricted thereto. As shown in FIG. 3, the number of the tuner sections may be two. In FIG. 3, corresponding parts to those of FIG. 1 are denoted by the same symbols, and the duplicative description is omitted.

In the configuration in FIG. 3, the tuner section 15-1 and the tuner section 15-2 are arranged in the transversal direction along the longer side of the circuit board 10.

While, in FIG. 3, the high-frequency signals once distributed at the distributor 13-1 are input to both of the tuner section 15-1 and the tuner section 15-2, the lengths of the transmission paths of the signals for the tuner section 15-1 and the tuner section 15-2 are different from each other. Even in this arrangement, the signal levels of the high-frequency signals input to the tuner section 15-1 and the tuner section 15-2 can be equalized by largely attenuating the signals in the attenuator 14-1 arranged nearer to the position of arranging the antenna input terminal.

Figure 4:
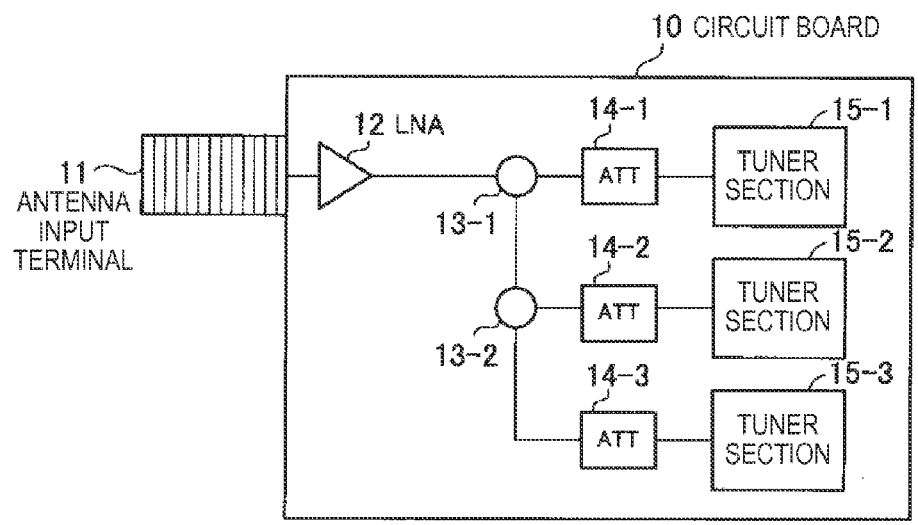
FIG. 4 is an exemplary configuration diagram of a circuit board when three high-frequency processing circuits are arranged in a vertical direction along a shorter side of the circuit board in accordance with an embodiment of the present disclosure.

Although, in the above-mentioned embodiments, the example of arranging the respective tuner sections 15 in the transverse direction along the longer side of the circuit board 10 is described, it is not restricted thereto. As shown in FIG. 4, the respective tuner sections 15 may be arranged in the vertical direction along the shorter side of the circuit board 10. In FIG. 4, corresponding parts to those of FIG. 1 and FIG. 3 are denoted by the same symbols, and the duplicative description is omitted.

In the arrangement shown in FIG. 4, the high-frequency signals once distributed at the distributor 13-1 are input to the tuner section 15-1, and the high-frequency signals twice distributed at the distributor 13-1 and the distributor 13-2 are input to the tuner section 15-2 and the tuner section 15-3. The lengths of the transmission paths for high-frequency signals are shorter in the tuner section 15-1, slightly longer in the tuner section 15-2, and further longer in the tuner section 15-3. Also in this arrangement, the amounts of attenuation of the attenuators 14-1 and 14-2 are adjusted such that the levels of the signals input to the tuner section 15-1 and the tuner section 15-2 are the same level as the signals input to the tuner section 15-3. Thereby, the input signal levels to the respective tuner sections 15 can be consolidated.

Figure 5:
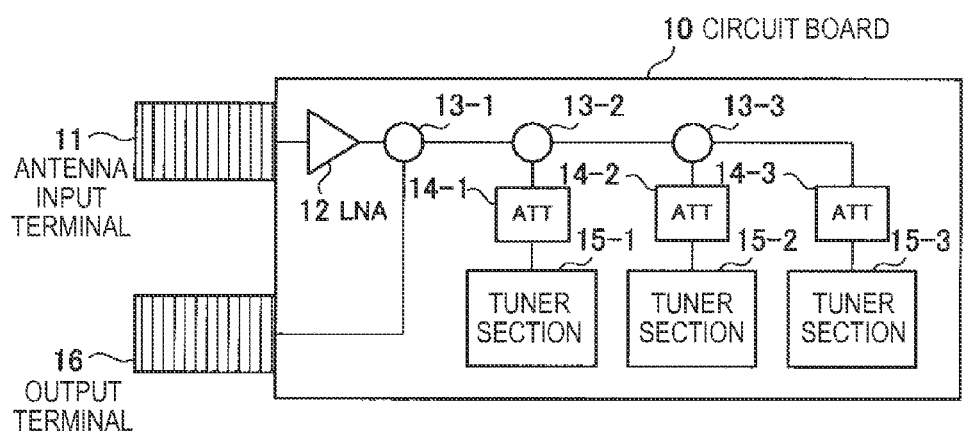
FIG. 5 is an exemplary configuration diagram of a circuit board when three high-frequency processing circuits are arranged in a transverse direction along a longer side of the circuit board including an antenna input terminal and an output terminal in accordance with an embodiment of the present disclosure.

Although, in the above-mentioned embodiment, the configuration of the circuit board 10 having only the antenna input terminal is described, the configuration further including an output terminal outputting the high-frequency signals can be employed. FIG. 5 shows a configuration in which the output terminal 16 is also mounted on the circuit board 10. In FIG. 5, corresponding parts to those of FIG. 1, FIG. 3 and FIG. 4 are denoted by the same symbols, and the duplicative description is omitted. The output terminal 16 is connected to other terminals such as a Blu-ray (registered trademark) disc recorder, a personal computer and a game terminal, and the high-frequency signals input from an antenna input terminal 11 are output.

Accordingly, one more stage of the distributor is provided in the configuration shown in FIG. 5. That is, a distributor 13-1 for distributing the high-frequency signals input from the antenna input terminal 11 into that to be supplied to the respective tuner sections 15 and into that to be output from the output terminal 16 is newly equipped in the subsequent stage of the LNA 12. A splitter having a loop-through function is employed as the distributor 13-1, for example.

In this configuration, the signals twice distributed by the distributor 13-1 and the distributor 13-2 are input to the tuner section 15-1 while the signals three times distributed by the distributors 13-1 to 13-3 are input to the tuner section 15-2 and the tuner section 15-3. The lengths of the transmission paths for transmitting the high-frequency signals after the distribution at the distributor 13-1 which depend on the distances from the antenna input terminal 11 to the respective tuner sections 15 are different from one another. Also in this arrangement, the amounts of attenuation of the attenuators 14-1 and 14-2 are adjusted such that the levels of the signals input to the tuner section 15-1 and the tuner section 15-2 are the same level as the signals input to the tuner section 15-3. Thereby, the input signal levels to the respective tuner sections 15 can be consolidated.

Figure 6:
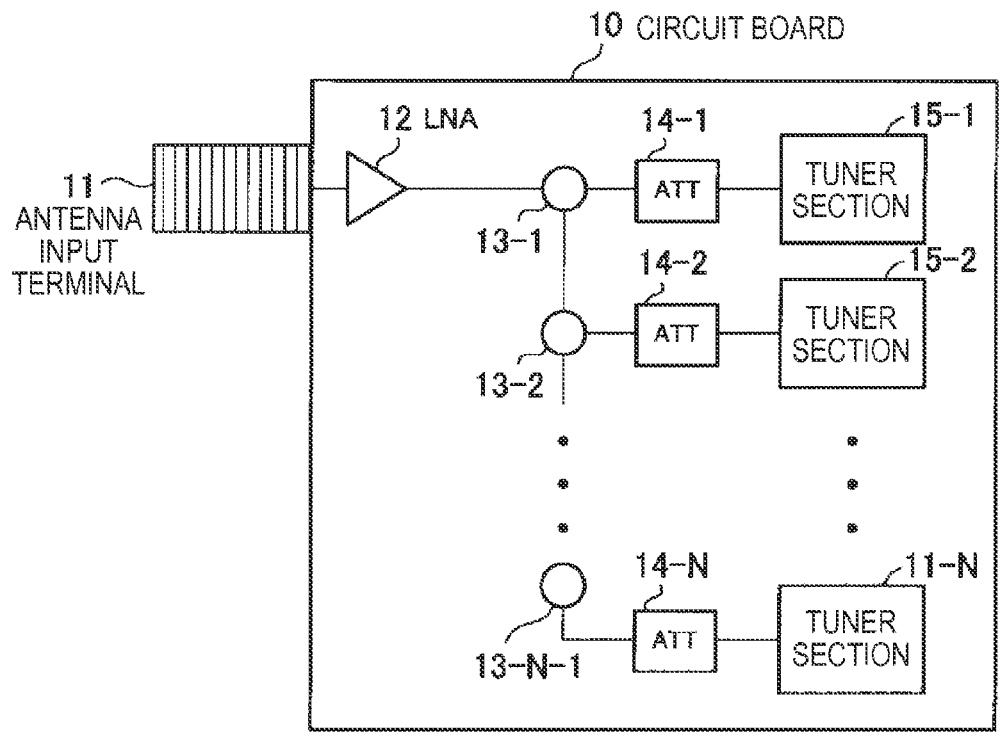
FIG. 6 is an exemplary configuration diagram of a circuit board when N high-frequency processing circuits are arranged in a transverse direction along a longer side of the circuit board including an antenna input terminal in accordance with an embodiment of the present disclosure.
Figure 7:
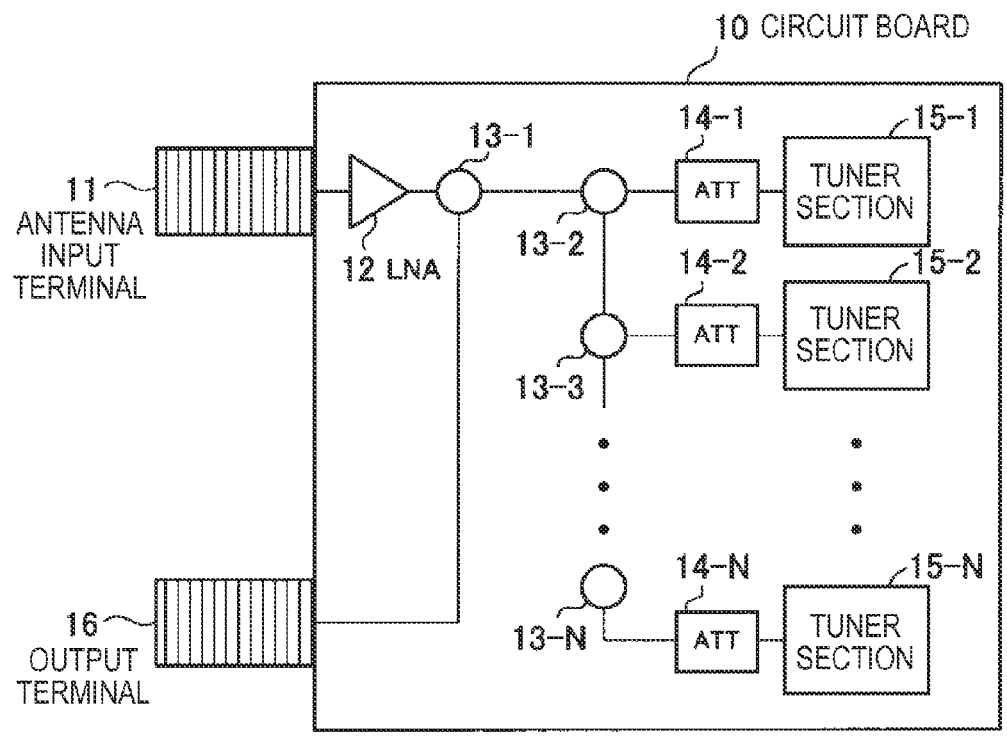
FIG. 7 is an exemplary configuration diagram of a circuit board when N high-frequency processing circuits are arranged in a transverse direction along a longer side of the circuit board including an antenna input terminal and an output terminal in accordance with an embodiment of the present disclosure.

Although, in the above-mentioned embodiments, the example having two or three tuner sections 15 is described, another number may be employed. FIG. 6 shows a configuration where N tuner sections 15 are amounted. When the number of tuner sections 5 is "N", the numbers of "N-1" distributors 13 and attenuators 14 may be mounted. As shown in FIG. 7, a configuration that the N tuner sections 15 are included and the output terminal 16 is included as well as the antenna input terminal 11 is included may be employed.

Figure 8:
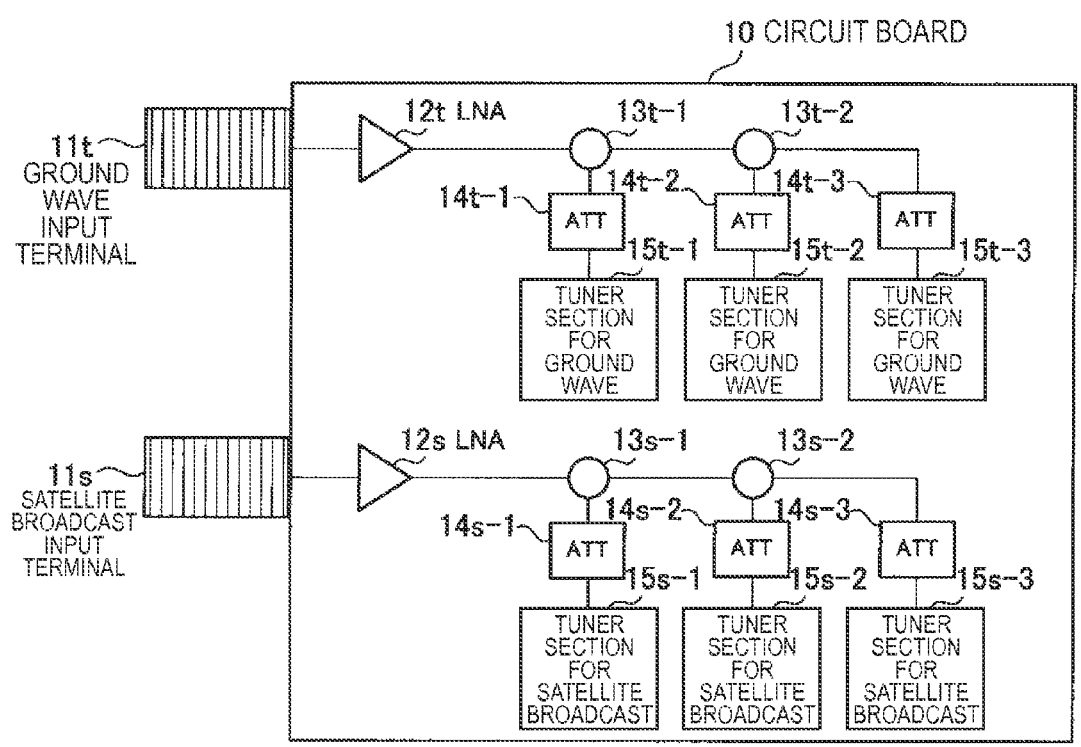
FIG. 8 is an exemplary configuration diagram when three high-frequency processing circuits receiving broadcast waves for a ground-wave digital television broadcast, and three high-frequency processing circuits receiving broadcast waves for a satellite broadcasting are arranged in the same circuit board in accordance with an embodiment of the present disclosure.

Although, in the above-mentioned embodiments, the example in which the respective tuner sections 15 receive the ground-wave digital television broadcast is shown, it is not restricted thereto, For example, the tuner sections 15 receiving waves for other broadcasts such as the satellite broadcast can be mounted. FIG. 8 is a diagram showing a configuration in which tuner sections for ground wave 15*t*-1 to 15*t*-3 receiving the ground-wave digital television broadcast and tuner sections for satellite broadcast 15*s*-1 to 15*s*-3 are mounted in parallel on one circuit board 10.

The circuit board 10 includes a ground wave input terminal 11*t* to which the high-frequency signals for the around-wave digital television broadcast are input, and a satellite broadcast input terminal 11*s* to which the high-frequency signals for the satellite broadcast are input. The LNA 12*t* is connected in a signal line in which the high-frequency signals input from the ground-wave input terminal 11*t* are transmitted, and the tuner sections for ground wave 15*t*-1 to 15*t*-3 are arranged in the transverse direction along the longer side of the circuit board 10 in the subsequent stage of the LNA 12*t*.

The high-frequency signals which are once distributed by the distributor 13*t*-1 and attenuated by the attenuator 14*t*-1 are input to the tuner section for ground wave 15*t*-1, and the high-frequency signals which are twice distributed by the istributor 13*t*-1 and the distributor 13*t*-2 and attenuated by the attenuator 14*t*-2 are input to the tuner section for ground wave 15*t*-2. The high-frequency signals which are twice distributed by the distributor 13*t*-1 and the distributor 13*t*-2 and attenuated by the attenuator 14*t*-3 are input to the tuner section for ground wave 15*t*-3.

The LNA 12*s* is connected in a signal line in which the high-frequency signals input from the satellite broadcast input terminal 11*s* are transmitted, and the tuner sections for satellite broadcast 15*s*-1 to 15*s*-3 are arranged in the transverse direction along the longer side of the circuit board 10 in the subsequent stage of the LNA 12*s*.

The high-frequency signals which are once distributed by the distributor 13*s*-1 and attenuated by the attenuator 14*s*-1 are input to the tuner section for satellite broadcast 15*s*-1, and the high-frequency signals which are twice distributed by the distributor 13*s*-1 and the distributor 13*s*-2 and attenuated by the attenuator 14*s*-2 are input to the tuner section for satellite broadcast 15*s*-2. The high-frequency signals which are twice distributed by the distributor 13*s*-1 and the distributor 13*s*-2 and attenuated by the attenuator 14*s*-3 are input to the tuner section for satellite broadcast 15*s*-3.

Even when the plurality of tuner sections 15 receiving the broadcast waves of the different broadcast systems are mounted in this manner, the amounts of attenuation established at the respective attenuators 14*t* and the respective attenuators 14*s* are established so as to be inversely proportional to the lengths of distances from the input terminal to the respective tuner sections 15. That is, the signals input to the tuner sections 15 arranged at positions nearer to the input terminal are largely attenuated while the signals input to the tuner sections 15 arranged at positions farther to the input terminal are attenuated at a medium degree or are not attenuated. In accordance with this configuration, all the signal levels of the high-frequency signals input to the respective tuner sections are equalized. Thereby, as shown in FIG. 8, the tuners receiving the same kinds of broadcast waves can be arranged in the transverse direction along the longer side of the circuit board 10 so that the thinning and the miniaturization of the receiving apparatus itself can be intended.

Although, in the above-mentioned embodiments, the examples having the IC chips acting as the respective tuner sections 15 are described, they are not restricted thereto. The respective tuner sections 15 may be configured as integrated circuits which are not chipped.

Although, in the above-mentioned embodiments, the examples having the attenuators 14 as the attenuating devices are described, they are not restricted thereto. Any resistive element may be employed.

Although, in the above-mentioned embodiments, the examples in which the high-frequency processing circuits are applied to the tuner sections of the receiving apparatus are described, they are not restricted thereto. For example, they may be applied to the tuner sections of other devices such as a cell phone unit. Other than the tuner sections, they may be applied to receiving circuits of receiving apparatuses receiving broadcast signals from broadcast stations.

Although, in the above-mentioned embodiments, the examples in which the high-frequency processing circuits are applied to the receiving circuits mounted on the receiving apparatus are described, they may be applied to transmitting circuits of transmitting apparatuses employed in broadcast stations, for example. In this case, the high-frequency signals which are transmitted from the high-frequency processing circuits are mixed by using not a distributor but a mixer, and an amplifier is arranged before the output terminal to output the high-frequency signals which are transmitted from the high-frequency processing circuits after amplification.

Additionally, the present disclosure may also be configured as below.

(1) A circuit board including:
an input terminal to which a high-frequency signal is input;
a high-frequency amplifier for amplifying the high-frequency signal input to the input terminal;
at least one distributor distributing the high-frequency signal;
a plurality of high-frequency processing circuits of which transmission path lengths for inputting each of the high-frequency signals distributed by the distributor into signal inputting sections of the plurality of high-frequency processing circuits are different from one another; and
a plurality of attenuating devices which are mounted at previous stages of each of the plurality of high-frequency processing circuits and possess amounts of attenuation which increase with decrease of the transmission path lengths.

(2) The circuit board according to (1), wherein the amounts of attenuation of each of the plurality of attenuating devices are established such that all of signal levels of the high-frequency signals input to each of the signal inputting sections of the plurality of high processing circuits are equalized.

(3) The circuit hoard according to (1) or (2), wherein the plurality of attenuating devices are attenuators.

(4) The circuit board according to any one of (1) to (3), wherein the plurality of attenuating devices are arranged near the signal inputting sections of the plurality of high-frequency processing circuits.

(5) The circuit board according to any one of (1) to (4), further including:
a high-frequency amplifier for amplifying the high-frequency signal input the input terminal.

(6) The circuit board according to any one of (1) to (5), wherein the plurality of high-frequency processing circuits are integrated circuits.

(7) The circuit board according to any one of (1) to (6), wherein the plurality of high-frequency processing circuits are arranged along a longer side of the circuit board.

(8) The circuit board according to any one of (1) to (7), wherein a number of the high-frequency processing circuits are at least three, and the distributors include a first distributor for distributing the high-frequency signal output from the high-frequency amplifier, and at least one second distributor for further distributing the high-frequency signal distributed by the first distributor.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

REFERENCE SIGNS LIST 10 circuit board
11 antenna input terminal
11a through-hole
11s satellite broadcast input terminal 11s
11t ground wave input terminal
12, 12s, 12t low noise amplifier (LNA)
13, 13-1, 13-2, 13s-1, 13s-2, 13t-1, 13t-2, 14, 14-1, 14-2, 14-3, 14s, 14s-1, 14s-2,
14s-3, 14t, 14t-1, 14t-2, 14t-3 attenuator
15, 15-1, 15-2, 15-2, 15-3 tuner section
15a, 15a-1 signal inputting section
15s-1, 15s-2, 15s-3 tuner section for satellite broadcast
15t-1, 15t-2, 15t-3 ground-wave tuner section for ground wave
16 output terminal

The invention claimed is:

1. A circuit board comprising:
an input terminal to which a high-frequency signal is input;
at least one distributor that distributes the high-frequency signal into a plurality of high-frequency signals;
a plurality of high-frequency processing circuits that receives each of the plurality of high-frequency signals distributed by the at least one distributor into signal inputting sections of the plurality of high-frequency processing circuits, wherein a distance of each of the plurality of high-frequency processing circuits from the input terminal is different; and
a plurality of attenuating devices which are mounted at previous stages of each of the plurality of the high-frequency processing circuits, wherein a value of attenuation for each of the plurality of attenuating devices is set based on the distance of respective high-frequency processing circuit of the plurality of high-frequency processing circuits from the input terminal,
wherein a number of the plurality of high-frequency processing circuits are at least three, and the at least one distributor includes a first distributor that distributes a high-frequency signal output from a high-frequency amplifier, and a second distributor that distributes the high-frequency signal distributed by the first distributor.

2. The circuit board according to claim 1, wherein
the value of attenuation of each of the plurality of attenuating devices is set such that signal levels of each of the plurality of high-frequency signals input to each of the signal inputting sections of the plurality of high-frequency processing circuits are equalized.

3. The circuit board according to claim 1, wherein
the plurality of attenuating devices are attenuators.

4. The circuit board according to claim 1, wherein
the plurality of attenuating devices are arranged near the signal inputting sections of the plurality of high-frequency processing circuits.

5. The circuit board according to claim 1, wherein
the high-frequency amplifier amplifies the high-frequency signal input to the input terminal.

6. The circuit board according to claim 1, wherein
the plurality of high-frequency processing circuits are integrated circuits.

7. The circuit board according to claim 1, wherein
the plurality of high-frequency processing circuits are arranged along a longer side of the circuit board.

8. The circuit board according to claim 1, wherein
the value of attenuation set for each of the plurality of attenuating devices is inversely proportional to the distance of the respective high-frequency processing circuit from the input terminal.

9. The circuit board according to claim 1, wherein
the value of attenuation for a first attenuating device of the plurality of attenuating devices that is arranged nearest to the input terminal is higher than the value of attenuation for a second attenuating device of the plurality of attenuating devices that is arranged farthest from the input terminal.

10. The circuit board according to claim 9, wherein
the value of attenuation for a third attenuating device of the plurality of attenuating devices, that is arranged between the first attenuating device and the second attenuating device, is between the value of attenuation for the first attenuating device and the value of attenuation of the second attenuating device.

11. The circuit board according to claim 1, wherein
the plurality of high-frequency processing circuits comprises a first set of high-frequency processing circuits that receives ground waves, and a second set of high-frequency processing circuits that receives satellite broadcast waves.

* * * * *